United States Patent
Baselmans et al.

(10) Patent No.: US 10,139,735 B2
(45) Date of Patent: Nov. 27, 2018

(54) LITHOGRAPHIC APPARATUS AND METHOD

(71) Applicant: ASML Netherlands B.V., Veldhoven (NL)

(72) Inventors: Johannes Jacobus Matheus Baselmans, Veldhoven (NL); Hans Butler, Veldhoven (NL); Christiaan Alexander Hoogendam, Veldhoven (NL); Sander Kerssemakers, Veldhoven (NL); Bart Smeets, Veldhoven (NL); Robertus Nicodemus Jacobus Van Ballegoij, Veldhoven (NL); Hubertus Petrus Leonardus Henrica Van Bussel, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/316,036

(22) PCT Filed: May 13, 2015

(86) PCT No.: PCT/EP2015/060618
§ 371 (c)(1),
(2) Date: Dec. 2, 2016

(87) PCT Pub. No.: WO2015/197260
PCT Pub. Date: Dec. 30, 2015

(65) Prior Publication Data
US 2017/0131642 A1 May 11, 2017

(30) Foreign Application Priority Data

Jun. 23, 2014 (EP) .................................... 14173493

(51) Int. Cl.
G02B 27/52 (2006.01)
G03F 7/20 (2006.01)

(52) U.S. Cl.
CPC ...... *G03F 7/70258* (2013.01); *G03F 7/70066* (2013.01); *G03F 7/70141* (2013.01); *G03F 7/70641* (2013.01)

(58) Field of Classification Search
CPC ............ G03F 7/70641; G03F 7/70141; G03F 7/70191; G03F 7/70258; G03F 7/70266;
(Continued)

(56) References Cited

U.S. PATENT DOCUMENTS 5,528,027 A * 6/1996 Mizutani ............. G03F 7/70358
250/234
5,617,182 A * 4/1997 Wakamoto .......... G03F 7/70358
355/51

(Continued)

FOREIGN PATENT DOCUMENTS

CN 101644901 A 2/2010
JP H10-321498 A 12/1998
(Continued)

OTHER PUBLICATIONS

Webb et al., "Improved Compensation for a Reduction Stepper to Meet the challenges for Advanced Packaging Applications," Rudolph Technologies, IMAPS' 47th International Symposium on Microelectronics, Oct. 2013; 6 pages.

(Continued)

*Primary Examiner* — Christina Riddle
(74) *Attorney, Agent, or Firm* — Sterne, Kessler, Goldstein & Fox P.L.L.C.

(57) ABSTRACT

A method of modifying a lithographic apparatus comprising an illumination system for providing a radiation beam, a support structure for supporting a patterning device to
(Continued)

impart the radiation beam with a pattern in its cross-section, a first lens for projecting the radiation beam at the patterning device with a first magnification, a substrate table for holding a substrate, and a first projection system for projecting the patterned radiation beam at a target portion of the substrate with a second magnification. The first lens and the first projection system together provide a third magnification. The method comprises reducing by a first factor the first magnification to provide a second lens for projecting the radiation beam with a fourth magnification; and increasing by the first factor the second magnification to provide a second projection system for projecting the patterned radiation beam at the target portion of the substrate with a fifth magnification.

24 Claims, 3 Drawing Sheets

(58) Field of Classification Search
CPC ............... G03F 7/70308; G03F 7/7055; G03F 7/70375; G03F 7/70725
USPC ............... 355/52, 53, 55, 67–71, 72, 75, 77; 250/492.1, 492.2, 492.22, 548; 430/5, 8, 430/22, 30, 311, 321
See application file for complete search history.

(56) References Cited

U.S. PATENT DOCUMENTS

| | | | |
|---|---|---|---|
| 5,955,243 A * | 9/1999 | Tanitsu | G03F 7/70058 355/50 |
| 5,982,558 A | 11/1999 | Furter et al. | |
| 6,252,662 B1 | 6/2001 | Sugita | |
| 7,349,068 B2 | 3/2008 | Van Der Mast et al. | |
| 7,382,439 B2 * | 6/2008 | Butler | G03F 7/70066 355/53 |
| 8,094,289 B2 | 1/2012 | Asaishi | |
| 2006/0132742 A1 | 6/2006 | Van Der Mast et al. | |
| 2006/0268251 A1 * | 11/2006 | Deguenther | G03F 7/70058 355/67 |
| 2006/0290911 A1 | 12/2006 | Jung | |
| 2007/0252094 A1 | 11/2007 | Ulrich et al. | |
| 2007/0279613 A1 | 12/2007 | Fiolka et al. | |
| 2010/0033698 A1 | 2/2010 | Sewell | |
| 2012/0092669 A1 | 4/2012 | Fiolka et al. | |
| 2013/0128250 A1 | 5/2013 | Van Der Veen | |
| 2013/0293859 A1 | 11/2013 | Wu et al. | |
| 2013/0321935 A1 | 12/2013 | Stites | |

FOREIGN PATENT DOCUMENTS

| | | |
|---|---|---|
| JP | H11-224851 A | 8/1999 |
| JP | 2006-173629 A | 6/2006 |
| JP | 2006-339634 A | 12/2006 |
| JP | 2009-164355 A | 7/2009 |
| JP | 2013-258284 A | 12/2013 |
| TW | 201329647 A1 | 7/2013 |
| WO | WO 2013/097897 A1 | 7/2013 |

OTHER PUBLICATIONS

International Search Report and Written Opinion of the International Searching. Authority, directed to related International Patent Application No. PCT/EP2015/060618, dated Oct. 19, 2015; 9 pages.
International Preliminary Report on Patentability directed to related International Patent Application No. PCT/EP2015/060618, dated Dec. 27, 2016; 7 pages.

* cited by examiner

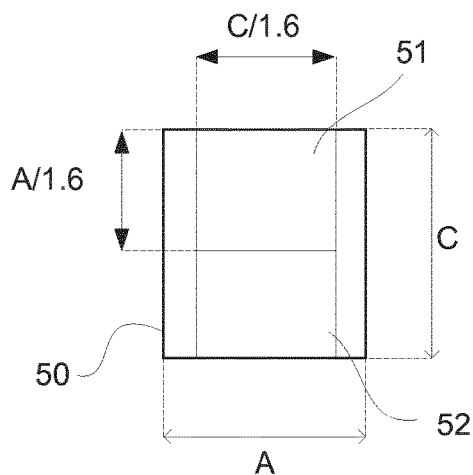 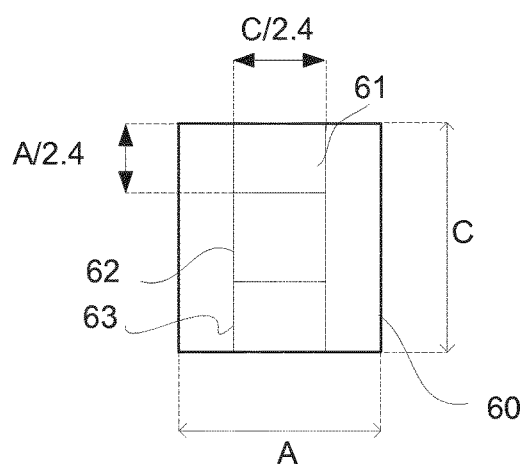
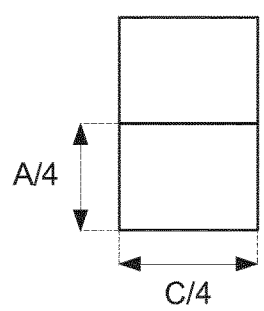 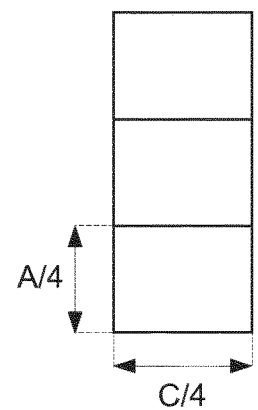
Fig. 3A　　　　　　　　　　Fig. 3B

LITHOGRAPHIC APPARATUS AND METHOD

CROSS-REFERENCES TO RELATED APPLICATIONS

This application claims the benefit of European patent application 14173493.9, which was filed on 23 Jun. 2014, and which is incorporated herein in its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

It is desirable to provide improved lithographic apparatuses and methods.

SUMMARY

According to a first aspect, there is provided a method of modifying a lithographic apparatus comprising an illumination system for providing a radiation beam, a support structure downstream of the illumination system for supporting a patterning device, the patterning device serving to impart the radiation beam with a pattern in its cross-section to provide a patterned radiation beam, a first lens for projecting the radiation beam at the patterning device with a first magnification, a substrate table downstream of the support structure for holding a substrate, and a first projection system for projecting the patterned radiation beam at a target portion of the substrate with a second magnification, the first lens and the first projection system together providing a third magnification. The method comprises reducing by a first factor the first magnification provided by the lens to provide a second lens for projecting the radiation beam with a fourth magnification; and increasing by the first factor the second magnification to provide a second projection system for projecting the patterned radiation beam at the target portion of the substrate with a fifth magnification.

The second lens and second projection system may together provide the third magnification. Alternatively, the second lens and second projection system may together provide a sixth magnification that is greater than the third magnification. The sixth magnification may be 1.27× greater than the third magnification.

The lens may be referred to as a REMA (reticle masking) lens herein.

By reducing the magnification of the lens, and increasing the magnification of the projection system, cost and throughput benefits may be achieved. For example, increased throughput may be achieved by a reduction in step time. Reduction of the first magnification may be achieved through modification or replacement of the lens. Similarly, increase of the second magnification may be achieved through modification or replacement of the projection system.

The first lens may be arranged to provide a magnification of between 1× and 4×. The first factor may have a value greater than one ('1') and less than or equal to four ('4'). For example, in some embodiments, the first lens may be arranged to provide a magnification of 1× and the first factor may be two ('2'). In other embodiments, the first lens may be arranged to provide a magnification 3× or 4×.

In other embodiments, the first factor may be 1.6, or may be 2.4.

The first projection system may be arranged to provide a magnification of 0.25× and the first factor may greater than 1 and less than or equal to 4.

The first lens may be arranged to provide a magnification of 1× and the first projection system may be arranged to provide a magnification 0.25×. The first factor may be 2, such that the second lens is arranged to provide a magnification of 0.5× and the second projection system is arranged to provide a magnification of 0.5×.

The first lens and the first projection system may be arranged to cooperatively cause the patterned radiation beam to have a size of substantially between 25 mm and 27 mm in a non-scanning direction of the lithographic apparatus at the target portion. The second lens and the second projection system may be arranged to cooperatively cause the patterned radiation beam to have a size of substantially between 25 mm and 34 mm in a non-scanning direction of the lithographic apparatus at the target portion. In this way, standard components both upstream of the lens and downstream of the projection system, may be used with the modified lithographic apparatus.

The lithographic apparatus may be arranged to cause the radiation beam to be scanned across a single target area of a substrate in a single scanning operation wherein the modified lithographic apparatus is arranged to cause the radiation beam to be scanned across at least two target areas of a substrate during a single scanning operation. In this way, the stepping time may be reduced by a factor of 2, leading to improved throughput.

The lithographic apparatus may be arranged to cause the radiation beam to be scanned across a surface of a patterning device at a first speed and the patterned radiation beam to be scanned across a target portion of the substrate at a second speed and the method may further comprise reducing the first speed by the first factor. In this way, the first radiation beam can be scanned across a patterned area of a patterning device having two patterned areas with a reduced speed. This may lead to reduced slippage of the patenting device.

The modified lithographic apparatus may be arranged to cause the radiation beam to be scanned across at least a first and second patterned area of a patterning device in a single scanning operation, the first and second patterned areas being disposed adjacent one another in a scanning direction of the modified lithographic apparatus.

According to a second aspect, there is provided a lithographic apparatus comprising an illumination system for providing a beam of radiation, a support structure downstream of the illumination system for supporting a patterning device, the patterning device serving to impart the radiation beam with a pattern in its cross-section to provide a patterned radiation beam. The lithographic apparatus further comprises a lens for projecting radiation beam at the patterning device with a magnification of between 0.5× and 2×, a substrate table downstream of the support structure for holding a substrate, and a projection system for projecting the patterned radiation beam at a target portion of the substrate with a magnification of 0.5×.

For example, the lithographic apparatus may comprise a lens having a magnification of 0.5× and a projection system having a magnification of 0.5×. In another example, the lithographic apparatus may comprise a lens having a magnification of 1.5× and a projection system having a magnification of 0.5×. In a further example, the lithographic apparatus may comprise a lens having a magnification of 2× and a projection system having a magnification of 0.5×.

Where both the lens and the projection system are arranged to provide a magnification of 0.5×, a combined magnification of 0.25× is provided by both the lens and the projection system. This embodiment may be particularly beneficial by allowing for two patterned areas of a patterning device to be scanned in a single scanning operation.

The lens and the projection system may be arranged to cooperatively cause the patterned radiation beam to have a size of substantially between 25 mm and 34 mm in a non-scanning direction of the lithographic apparatus at the target portion. In this way, standard substrates and target areas may be used. For example, standard dies often have a size up to 26 mm in the non-scanning direction.

The lithographic apparatus may be arranged to cause the radiation beam to be scanned across a surface of a patterning device in a single scanning operation and may be arranged to cause the radiation beam to be scanned across at least two target areas of a substrate during the single scanning operation.

In this way, at least two target areas (e.g. two dies or exposure fields) of a substrate (e.g. a wafer) may be patterned in a single scanning operation. In this way, a speed at which the radiation beam is scanned over the patterning device may be reduced (for example halved) while still achieving an increased throughput compared to a conventional lens and projection system arrangement.

The lithographic apparatus may further be arranged to cause the radiation beam to be scanned across at least a first and second patterned area of a patterning device, the first and second patterned areas being disposed adjacent one another in a scanning direction of the lithographic apparatus. The lithographic apparatus may be arranged to cause the radiation beam to be scanned across both the first patterned area and the second patterned area in a single scanning operation.

The lithographic apparatus may be arranged to cause the radiation beam to be scanned across a surface of a patterning device at a first speed and the patterned radiation beam to be scanned across a target portion of the substrate at a second speed. The first speed may be more than twice the second speed.

In this way, throughput may be increased further to the increase provided by the reduction in step time.

According to a third aspect, there is provided a method comprising, projecting a radiation beam at a patterning device with a magnification of between 0.5× and 2× to impart the radiation beam with a pattern in its cross-section, and projecting the patterned radiation beam onto a target portion of a substrate with a magnification of 0.5×.

The patterned radiation beam may have a size of substantially between 25 mm and 34 mm in a non-scanning direction of the lithographic apparatus at the target portion.

The method may further comprise causing the radiation beam to be scanned across the surface of the patterning device in a single scanning operation and causing the patterned radiation beam to be scanned across at least two target areas of the substrate during the single scanning operation.

The method may further comprise causing the radiation beam to be scanned across a surface of the patterning device at a first speed and causing the patterned radiation beam to be scanned across the substrate at a second speed.

The method may further comprise providing a patterning device comprising a first patterned area and a second patterned area, the first and second patterned areas being adjacent each other in a scanning direction of the lithographic apparatus.

The method may further comprise causing the radiation beam to be scanned across both the first patterned area and the second patterned area in a single scanning operation.

The first speed may be more than twice the second speed. In this way, additional throughput increases may be achieved.

It will be appreciated that features presented in the context of one aspect of the invention in this description can equally be applied to other aspects of the invention.

It will be appreciated that aspects of the present invention can be implemented in any convenient way including by way of suitable hardware and/or software. For example, a switching device arranged to implement embodiments of the invention may be created using appropriate hardware components. Alternatively, a programmable device may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals. Methods for operating switching devices are also provided by the invention.

BRIEF DESCRIPTION OF THE DRAWINGS

Embodiments of the invention will now be described, by way of example, only, with reference to the accompanying schematic drawings, in which:

FIGS. 3A 3B are schematic illustrations of illumination fields projected onto a patterning device having rotated patterned areas and of corresponding image fields projected onto rotated target areas of a substrate.

DETAILED DESCRIPTION

Figure 1:
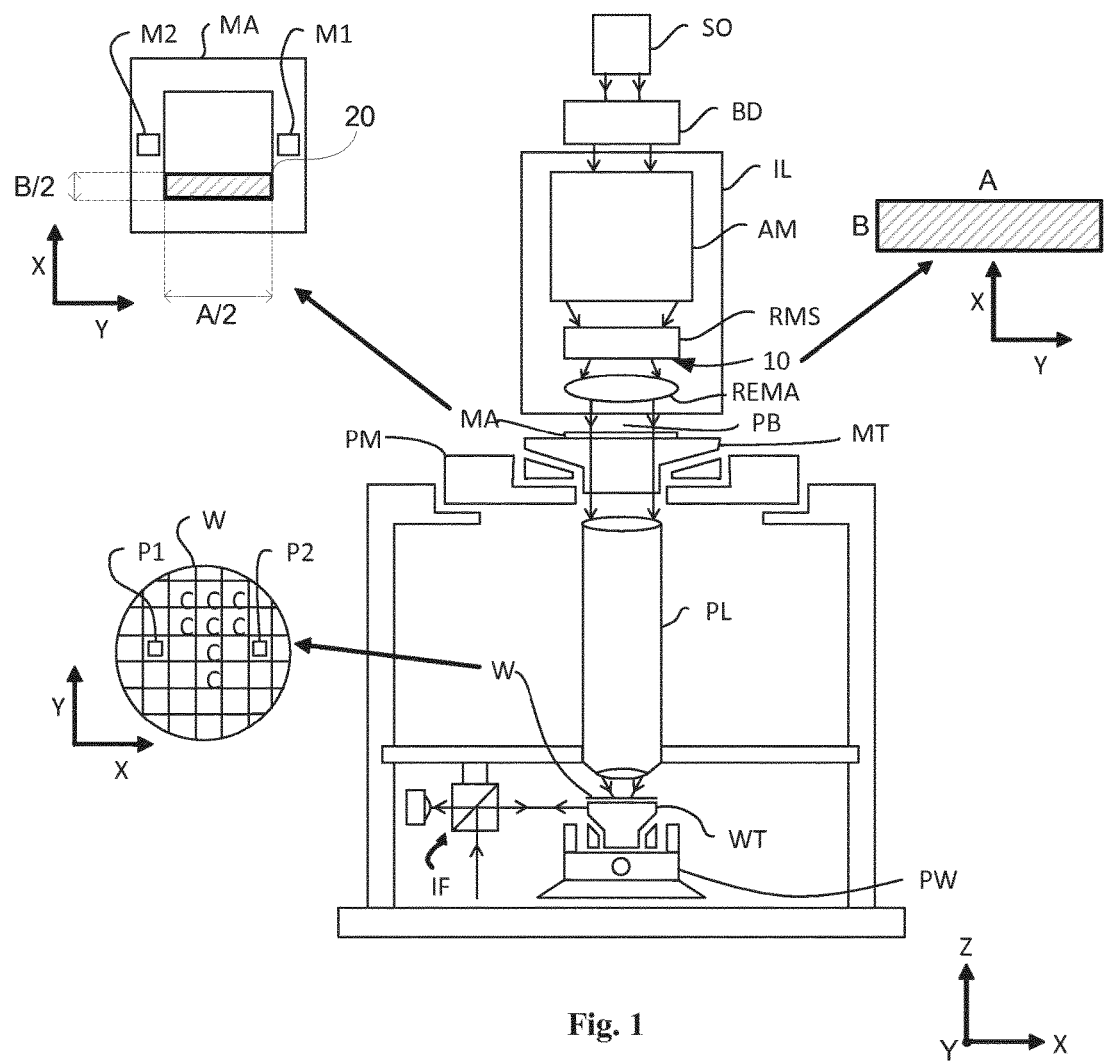
FIG. 1 is a schematic illustration of a lithographic apparatus comprising an illuminator.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Terms "first", "second", etc. as used herein do not denote a temporal or ordering relationship unless otherwise indicated.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens". The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:
  an illumination system (illuminator) IL to condition a beam PB of radiation (e.g. UV radiation).
  a support structure (e.g. a support structure) MT to support a patterning device (e.g. a mask) MA and connected to first positioning device PM to accurately position the patterning device with respect to item PL;
  a substrate table (e.g. a wafer table) WT for holding a substrate (e.g. a resist coated wafer) W and connected to second positioning device PW for accurately positioning the substrate with respect to item PL; and
  a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

It is to be understood that the terms "upstream" and "downstream" as used herein relate to relative positions along an optical path, where "upstream" relates to positions optically closer to the source SO. That is, if a first component is described as being "upstream" of a second component, it is to be understood that the first component is optically closer to the source SO than the second component.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as a reticle masking system RMS and a Reticle Mask (REMA) lens (or objective) to direct the radiation beam to the patterning device MA. The reticle masking system RMS defines an object plane 10 and the REMA lens images the object plane on the patterning device MA to define an illumination field 20. The illuminator IL therefore provides a conditioned beam of radiation PB, having a desired uniformity and intensity distribution in its cross section.

While shown as part of the illuminator IL in FIG. 1, either or both of the reticle masking system and the REMA lens may be considered to be separate from the illuminator IL in some embodiments. Further, it will be appreciated that while the term 'lens' is used herein, the REMA lens may comprise a plurality of optical elements including a plurality of lenses, mirrors, etc.

The radiation beam PB is incident on the patterning device (e.g. mask) MA, which is held on the support structure MT. In particular, the radiation beam PB defines an illumination field 20 (schematically illustrated in FIG. 2). Having traversed the patterning device MA, the beam PB passes through the projection lens PL, which focuses the radiation beam PB onto a target portion C of the substrate W. The illuminated portion of the substrate W may be referred to as the image field. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2.

The support structure MT and the substrate table WT are scanned synchronously (in the x-dimension of the spatial axes depicted in FIG. 1) while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. The maximum size of the exposure field limits the width (in the non-scanning direction) of the target portion in a single dynamic exposure, whereas the length of the scanning motion determines the height (in the scanning direction) of the target portion.

In an embodiment, a magnification provided by each of the REMA lens and the projection system PL is modified in such a way that an overall magnification applied by the combination of the REMA lens and the projection system PL remains constant. For example, an amount of magnification with which the REMA lens images the object plane 10 may be reduced by a factor of 2 in comparison to an existing REMA lens.

By way of example, where a REMA lens of a lithographic apparatus provides a magnification of 1× (i.e. causes no increase or decrease in size of the image of the radiation beam PB), a magnification provided by the REMA lens may be halved. That is, where a lithographic apparatus provides a REMA having a magnification of 1×, the modified REMA lens may provide magnification of 0.5×. That is, the modified REMA lens may be arranged to reduce the cross sectional area of the radiation beam PB by a factor of 2. In this example, assuming that the reticle masking system RMS is arranged to provide a rectangular radiation beam to the REMA lens having a dimension of A in the non-scanning dimension (the Y-dimension in the spatial axes provided in FIG. 1) and a dimension of B in the scanning dimension (the X-dimension in the spatial axes provided in FIG. 1), the illumination field 20 provided by the REMA lens would have dimensions of A/2 in the non-scanning dimension and B/2 in the scanning dimension, at the patterning device MA.

A magnification provided by the projection system PL is also modified. In particular, the magnification provided by the projection system PL is modified so as to retain the same overall level of magnification of the laser beam PB between the object plane 10 and the image field on the substrate W. In the above example, therefore, in which a magnification provided by the REMA lens is decreased by a factor of 2, a magnification of the projection system PL is increased by a factor of 2. For example, where an original projection system PL is arranged to provide a magnification of 0.25×, the modified projection system PL is arranged to provide a magnification of 0.5×. That is, the modified projection lens PL is arranged to reduce the cross-sectional area of the radiation beam PB received from the REMA lens by a factor of 2.

This is in contrast to conventional projection lenses, which are often arranged to provide a magnification of 0.25×. Providing a magnification of 0.25× requires a complex, and therefore costly, projection lens arrangement. However, as, in the presently described embodiment, the magnification provided by the REMA lens is halved, a total magnification of 0.25×, between the object plane 10 and the image field on the substrate W, may be achieved with a relatively simple projection system PL.

Figure 2:
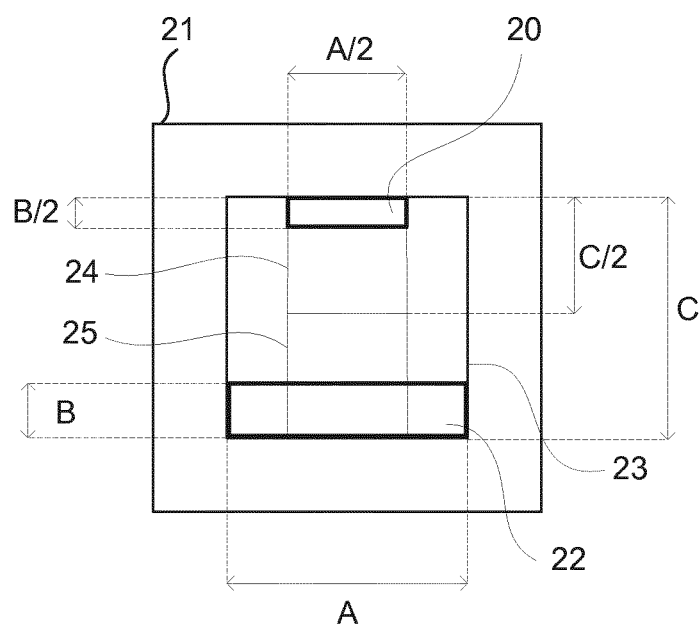
FIG. 2 is a schematic illustration of illumination fields projected onto a patterning device of the lithographic apparatus of FIG. 1.

For comparison purposes, an illumination field provided by the embodiment of FIG. 1 and an illumination field provided by a conventional lithographic apparatus are schematically depicted on a patterning device 21 in FIG. 2. In general, patterning devices (e.g. masks, reticles) are of a standard size to allow receipt of the patterning device within lithographic apparatus. An illumination field 22 as produced by a conventional REMA lens has a size of A in the non-scanning direction and a size of B in the scanning direction. Scanning of the support structure MT causes the illumination field 22 to be scanned over a single patterned area 23 (comprising a pattern to be imaged on a target portion of the substrate) having a size of A in the non-scanning direction and a size of C in the scanning direction. As such, the illumination field 22 traverses the patterned area 23 once in each scanning pass.

There is also depicted the illumination field 20 provided by the illuminator IL of FIG. 1 comprising a REMA lens arranged to apply a de-magnification factor of 2 to the radiation beam received at the REMA lens from the reticle masking system RMS. The illumination field 20 has a size A/2 in the non-scanning direction and a size of B/2 in the scanning direction. Movement of the support structure MT causes the illumination field 20 to be scanned over two patterned areas 24, 25 in a single scanning pass. It will be appreciated that as the illumination field 20 is half the size, the features on each of the patterned areas 24, 25 are half the size of the features on the single patterned area 23 in both the scanning and non-scanning directions.

As such, for a scanning pass of half the speed, the illuminator IL of FIG. 1 is able to scan one of the patterned areas 24, 25 of the patterning device MA in the same time taken by a conventional lithographic apparatuses to scan the single patterned area 23.

Additionally, having scanned the first patterned area 24, the illuminator IL is able to immediately proceed to scan the further patterned area 25 without performing a stepping operation. As such, a number of stepping operations (and therefore a total step time) is reduced by a factor of 2. As such, a throughput of the lithographic apparatus may be increased despite a decrease in the scanning speed of the support structure.

Additionally, by reducing the speed of the support structure by a factor of 2, lower acceleration (and deceleration) of the support structure is required during scanning. Lower acceleration can help to prevent slippage of the patterning device during scanning, and in particular during directional changes.

Further, by inversely modifying the magnification provided by the projection lens PL and the REMA lens, the size of the image field at the substrate W remains the same. As such, standard sizes of substrates and dies may be utilised. For example, dies on a substrate are commonly 26 mm×33 mm.

It will be appreciated that in conventional lithographic apparatuses, where a projection lens is arranged to provide a magnification of 0.25×, the support structure MT is scanned at a scanning speed that is four times greater than the scanning speed of the – substrate table WT. In the embodiment of FIG. 1 (wherein a magnification of the REMA lens is halved), the support structure MT need only be scanned at twice the speed of the substrate table WT. As such, by providing a demagnifying REMA lens in combination with a demagnifying projection lens PL, a reduction in the scanning speed of the support structure MT may be achieved while achieving a higher throughput (e.g. number of dies patterned in a predetermined time period) due to a reduction in stepping time.

Referring again to FIG. 2, if a scanning speed of V is used to scan the illumination field 22 over the patterned area 23 in a defined scanning period, a scanning speed of V/2 may be used to scan the illumination field 20 over one of the patterned areas 24, 25 in the same scanning period. By reducing the scanning speed of the support structure MT, a simpler and therefore less expensive patterning device scanning system may be used.

Additionally, a further increase in throughput may be achieved by retaining the scanning speed of the support structure MT and increasing the scanning speed of the substrate table WT by a factor of 2. In this way, two patterned areas 24, 25 can be scanned in the time taken to scan a single patterned area 23 in a conventional lithographic apparatus. In this case, therefore, throughput improvements result from both an increased scan speed of each patterned area and the reduction in step time.

Further, by providing a projection lens PL with an increased magnification combination with a REMA lens having a correspondingly reduced magnification, the cost, complexity and throughput improvements described above may be achieved without changes to any components of the lithographic apparatus upstream of the REMA lens. That is, for example, the source SO, the beam delivery system BD, the adjustment mechanism AM and the reticle masking system RMS may all be of standard configuration (e.g. configured as though for use with a standard REMA lens and a standard 0.25× magnification projection lens). As such, an existing lithography apparatus may be relatively easily retrofitted for, for example, higher throughput without replacing any component upstream of the REMA lens.

While the above examples are concerned with modifying lithographic apparatuses having a REMA lens which provides unit magnification (a magnification of 1×) in combination with a projection systems PL that provides a magnification of 0.25×, so as to provide a lithographic apparatus with a REMA lens providing 0.5× magnification with a projection system PL providing 0.5× magnification, it will be appreciated that other lithographic apparatuses comprise REMA lenses and projection systems which provide different magnifications. Lithographic apparatuses comprising a REMA lens with unit magnification may be what are commonly known as immersion lithographic apparatuses. In an embodiment, therefore, there is provided an immersion lithographic apparatus having a REMA lens with a magnification of 0.5× and a projection system with a magnification of 0.5×.

For example, in some embodiments, a lithographic apparatus (for example a "dry", or non-immersion apparatus) may comprise a REMA lens with a magnification of between 3×-4× in combination with a projection system PL providing a magnification of 0.25×. In an embodiment, therefore, there may be provided a lithographic apparatus comprising a REMA lens having a magnification of between 1.5×-2× and a projection system PL having a magnification of 0.5×.

More generally, a REMA lens may provide a first non-unit magnification and the projection system PL may provide a second non-unit magnification, such that a desired total (de)magnification is provided between the reticle masking system RMS and the substrate W. In this way, an image field having a desired size (for example 26 mm in a non-scanning dimension) may be obtained without changes to components upstream of the REMA lens.

Additionally, while the above described example embodiments are concerned reducing a magnification provided by a REMA lens by a factor of 2 while simultaneously increasing a magnification provided by a projection system PL by a factor of 2, the magnification provided by each of the REMA lens and the projections system may be changed by different amounts while retaining the same overall magnification between the object plane 10 and the image on the substrate W. For example, a magnification provided by a REMA lens may be reduced by a factor of 3 (e.g. from 1× to 0.33×), while a magnification provided by a projection system PL may be increased by a factor of 3 (e.g. from 0.25× to 0.75×), while retaining an total demagnification of 0.25× between the reticle masking system RMS and the substrate W.

More generally, therefore, a magnification provided by a REMA lens may be reduced by a first factor, while a magnification provided by a projection system PL may be increased by the first factor.

FIG. 3 illustrates an embodiment in which the first factor is selected to allow scanning of 'rotated' patterned areas for exposure on two rotated target portions of a substrate. In the example of FIG. 3 it is assumed that the original REMA lens provides a magnification of 1× while the original projection system PL provides a magnification of 0.25×. To provide rotated target portions on the substrate, the substrate is rotated before mounting on the substrate table WT.

Referring to FIG. 3A, a patterning device 50 comprises two patterned areas 51, 52. The patterning device 50 has dimensions of A in the non-scanning direction and C in the scanning direction (up/down the page in FIG. 3). Each patterned area 51, 52, however, occupies an area of approximately A/1.6 in the scanning direction and C/1.6 in the non-scanning direction (from left-to-right in FIG. 3). For example, where the reticle masking system RMS provides an object plane 10 of dimensions A=104 mm and B=132 mm, each patterned area 51, 52 has dimensions of approximately 65 mm in the scanning direction and 82.5 mm in the non-scanning direction. This example embodiment may use a projection lens PL having a magnification of 0.39×.

The magnifications provided by REMA lens and the projection system PL are modified to provide an image field at the substrate of C/4 in the non-scanning direction to be scanned over an area of A/4 in the scanning direction for each target area. Using the above example dimensions, therefore, the modified projection system PL provides an image field at the substrate of 33 mm in the non-scanning direction.

It will be appreciated, that whereas the original REMA lens and the original projection system PL provided a combined magnification of 0.25×, as the image field at the substrate has increased by 7 mm in the non-scanning direction, the combined magnification of the REMA lens and the projection system PL is increased (by a factor of approximately 1.27).

FIG. 3B illustrates a similar embodiment, in which the first factor is selected to allow for scanning of three rotated patterned areas for exposure on three rotated target portions of a substrate.

Referring to FIG. 3B, a patterning device 60 comprises three patterned areas 61, 62, 63. The patterning device 60 has dimensions of A in the non-scanning direction and C in the scanning direction. Each patterned area 61, 62, 63, however, occupies an area of approximately A/2.4 in the scanning direction and C/2.4 in the non-scanning direction. For example, where the reticle masking system RMS provides an object plane 10 of dimensions A=104 mm and B=132 mm, each patterned area 61, 62, 63 has dimensions of approximately 55.8 mm in the non-scanning direction and 44 mm in the scanning direction. This example may use a projection lens PL having a magnification of 0.59×.

The magnifications provided by REMA lens and the projection system PL are modified to provide an image field at the substrate of C/4 in the non-scanning direction to be scanned over an area of A/4 in the scanning direction for each target area. Using the above example dimensions, therefore, the modified projection system PL provides an image field at the substrate of 33 mm in the non-scanning direction.

As in the example of FIG. 3A, it will be appreciated, that whereas the original REMA lens and the original projection system PL provided a combined magnification of 0.25×, as the image field at the substrate has increased by 7 mm in the non-scanning direction, the combined magnification of the REMA lens and the projection system PL is increased (by a factor of approximately 1.27).

Additionally, while in the embodiments described above both the REMA lens and the projection system provide a non-unit magnification (a non 1× magnification), in some embodiments the projection system is arranged so as to provide a magnification of 1×. For example, for a projection system PL providing a magnification of 0.25×, the first factor may be 4, such that a magnification provided by the projection system PL is 1×. This allows for a particularly simple projection lens arrangements to be used. Further, where the projection lens provides no de-magnification to the laser beam PB, the substrate table WT may be scanned at the same speed as the support structure MT.

In embodiments described above, an existing lithographic apparatus is modified (e.g. retrofitted). For example, where it is described that a magnification of a REMA lens may be reduced, such reduction may be achieved by modifying or replacing the REMA lens within an existing lithographic apparatus. Other embodiments comprise lithographic apparatuses which are created with a REMA lens and projection system already having the desired magnification qualities. For example, in an embodiment, a lithographic apparatus may be created having a REMA lens that provides a magnification of 0.5× and a projection system that provides a magnification of 0.5×. Additionally, manufacture of new lithographic apparatuses is facilitated, as other components of the optical column (such as the reticle masking system, etc.) may be re-used.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of modifying a lithographic apparatus comprising an illumination system for providing a radiation beam, a support structure downstream of the illumination system for supporting a patterning device, the patterning device serving to impart the radiation beam with a pattern in its cross-section to provide a patterned radiation beam, a first lens for projecting the radiation beam at the patterning device with a first magnification, a substrate table downstream of the support structure for holding a substrate, and a first projection system for projecting the patterned radiation beam at a target portion of the substrate with a second magnification, the first lens and the first projection system together providing a third magnification, the method comprising:

reducing by a first factor the first magnification provided by the first lens to provide a second lens for projecting the radiation beam with a fourth magnification; and increasing by the first factor the second magnification to provide a second projection system for projecting the patterned radiation beam at the target portion of the substrate with a fifth magnification.

2. The method of claim 1, wherein the first lens is arranged to provide a magnification of between 1× and 4× and wherein the first factor is greater than 1 and less than or equal to 4.

3. The method of claim 1, wherein the first projection system is arranged to provide a magnification of 0.25× and wherein the first factor is greater than 1 and less than or equal to 4.

4. The method of claim 1, wherein:
the first lens is arranged to provide a magnification of 1× and the first projection system is arranged to provide a magnification of 0.25×; and
the first factor is 2 such that the second lens is arranged to provide a magnification of 0.5× and the second projection system is arranged to provide a magnification of 0.5×.

5. The method of claim 1, wherein:
the first lens and the first projection system are arranged to cooperatively cause the patterned radiation beam to have a size of substantially between 25 mm and 27 mm in a non-scanning direction of the lithographic apparatus at the target portion; and
the second lens and the second projection system are arranged to cooperatively cause the patterned radiation beam to have a size of substantially between 25 mm and 34 mm in a non-scanning direction of the lithographic apparatus at the target portion.

6. The method apparatus of claim 1, wherein the lithographic apparatus is arranged to cause the radiation beam to be scanned across a single target area of the substrate in a single scanning operation and the modified lithographic apparatus is arranged to cause the radiation beam to be scanned across at least two target areas of the substrate during a single scanning operation.

7. The method of claim 1, wherein the lithographic apparatus is arranged to cause the radiation beam to be scanned across a surface of the patterning device at a first speed and the patterned radiation beam to be scanned across the target portion of the substrate at a second speed and the method comprises reducing the first speed by the first factor.

8. The method of claim 1, wherein the modified lithographic apparatus is arranged to cause the radiation beam to be scanned across at least a first and second patterned area of the patterning device in a single scanning operation, the first and second patterned areas being disposed adjacent one another in a scanning direction of the modified lithographic apparatus.

9. The method of claim 1, wherein the second lens and second projection system together provide the third magnification.

10. The method of claim 1, wherein the second lens and second projection system together provide a sixth magnification greater than the third magnification.

11. The method of claim 10, wherein the sixth magnification is approximately 1.27× greater than the third magnification.

12. A lithographic apparatus comprising:
an illumination system configured to provide a radiation beam;
a support structure downstream of the illumination system configured to support a patterning device, the patterning device serving to impart the radiation beam with a pattern in its cross-section to provide a patterned radiation beam;
a lens configured to project the radiation beam at the patterning device with a magnification of 0.5×;
a substrate table downstream of the support structure configured to hold a substrate; and
a projection system configured to project the patterned radiation beam at a target portion of the substrate with a magnification of 0.5×.

13. The lithographic apparatus of claim 12, wherein the lens and the projection system are arranged to cooperatively cause the patterned radiation beam to have a size of substantially between 25 mm and 34 mm in a non-scanning direction of the lithographic apparatus at the target portion.

14. The lithographic apparatus of claim 12, wherein the lithographic apparatus is arranged to cause the radiation beam to be scanned across a surface of the patterning device in a single scanning operation and the lithographic apparatus is arranged to cause the radiation beam to be scanned across at least two target areas of the substrate during the single scanning operation.

15. The lithographic apparatus of claim 12, wherein the lithographic apparatus is arranged to cause the radiation beam to be scanned across a surface of the patterning device at a first speed and the patterned radiation beam to be scanned across the target portion of the substrate at a second speed.

16. The lithographic apparatus of claim 15, wherein the first speed is more than twice the second speed.

17. The lithographic apparatus of claim 12, wherein the lithographic apparatus is arranged to cause the radiation beam to be scanned across at least a first and second patterned area of the patterning device in a single scanning operation, the first and second patterned areas being disposed adjacent one another in a scanning direction of the lithographic apparatus.

18. A method comprising:
projecting a radiation beam at a patterning device of a lithographic apparatus with a lens with a magnification of 0.5× to impart the radiation beam with a pattern in its cross-section; and
projecting the patterned radiation beam onto a target portion of a substrate with a magnification of 0.5×.

19. The method of claim 18, further comprising causing the radiation beam to be scanned across a surface of the patterning device in a single scanning operation and causing the patterned radiation beam to be scanned across at least two target areas of the substrate during the single scanning operation.

20. The method of claim 18, further comprising causing the radiation beam to be scanned across a surface of the patterning device at a first speed and causing the patterned radiation beam to be scanned across the substrate at a second speed.

21. The method of claim 20, wherein the first speed is more than two times greater than the second speed.

22. The method of claim 18, further comprising providing the patterning device comprising a first patterned area and a second patterned area, the first and second patterned areas being adjacent each other in a scanning direction of the lithographic apparatus.

23. The method of claim 22, further comprising causing the radiation beam to be scanned across both the first patterned area and the second patterned area in a single scanning operation.

24. The method of claim 18, further comprising causing the patterned radiation beam to have a size of substantially between 25 mm and 34 mm in a non-scanning direction of the lithographic apparatus at the target portion.

* * * * *